(12) United States Patent
Schmidt et al.

(10) Patent No.: US 7,715,457 B2
(45) Date of Patent: May 11, 2010

(54) HIGH POWER SEMICONDUCTOR LASER DIODE

(75) Inventors: Berthold Schmidt, Jona (CH); Susanne Pawlik, Zurich (CH)

(73) Assignee: Oclaro Technology plc, Northamptonshire (GB)

( * ) Notice: Subject to any disclaimer, the term of this patent is extended or adjusted under 35 U.S.C. 154(b) by 177 days.

(21) Appl. No.: 12/094,316

(22) PCT Filed: Nov. 20, 2006

(86) PCT No.: PCT/GB2006/050399

§ 371 (c)(1),
(2), (4) Date: May 20, 2008

(87) PCT Pub. No.: WO2007/057715

PCT Pub. Date: May 24, 2007

(65) Prior Publication Data

US 2008/0273563 A1    Nov. 6, 2008

(30) Foreign Application Priority Data

Nov. 21, 2005   (GB)   ................................. 0523625.2

(51) Int. Cl.
*H01S 5/00*   (2006.01)
(52) U.S. Cl. .................... 372/43.01; 372/49.01; 372/87
(58) Field of Classification Search ............. 372/43.01, 372/49.01
See application file for complete search history.

(56) References Cited

U.S. PATENT DOCUMENTS 5,032,219 A   7/1991  Buchmann et al.

(Continued)

FOREIGN PATENT DOCUMENTS

| EP | 0 663 710 A | 7/1995 |
|---|---|---|
| JP | 61-212082 | 9/1986 |
| WO | 2005/006507 | 1/2005 |

OTHER PUBLICATIONS

International Search Report for corresponding Application No. PCT/GB2006/050399 dated Feb. 6, 2007.

(Continued)

*Primary Examiner*—Dung T Nguyen
(74) *Attorney, Agent, or Firm*—Renner, Otto, Boisselle & Sklar, LLP

(57) ABSTRACT

Semiconductor laser diodes, particularly high power AlGaAs-based ridge-waveguide laser diodes, are often used in opto-electronics as so-called pump lasers for fiber amplifiers in optical communication lines. To provide the desired high power output and stability of such a laser diode and avoid degradation during use, the present invention concerns an improved design of such a device, the improvement in particular significantly minimizing or avoiding (front) end section degradation of such a laser diode and significantly increasing long-term stability. This is achieved by separating the waveguide ridge into an active main ridge section (4) and at least one separate section (12) located at an end of the laser diode, which may be passive. The separation is provided by a trench or gap (10) in the waveguide ridge. The active waveguide section (4) is at least partly covered by the electrode (6) providing the carriers that does not extend to cover the separate ridge section (12), which thus remains essentially free of carriers injected through said electrode (6). There may be a plurality such separate ridge sections, e.g. two separate ridge sections (12, 212), one at each end of the laser diode, dividing the ridge waveguide into three ridge sections, an active main ridge section (4) in the center and a passive separate ridge section (12, 212) at either end. The trenches (10, 110) between the sections and/or the shape and size of the separate ridge section (s) (12, 212) may be adjusted to act as spatial mode filters.

19 Claims, 14 Drawing Sheets

U.S. PATENT DOCUMENTS

Figure 1:
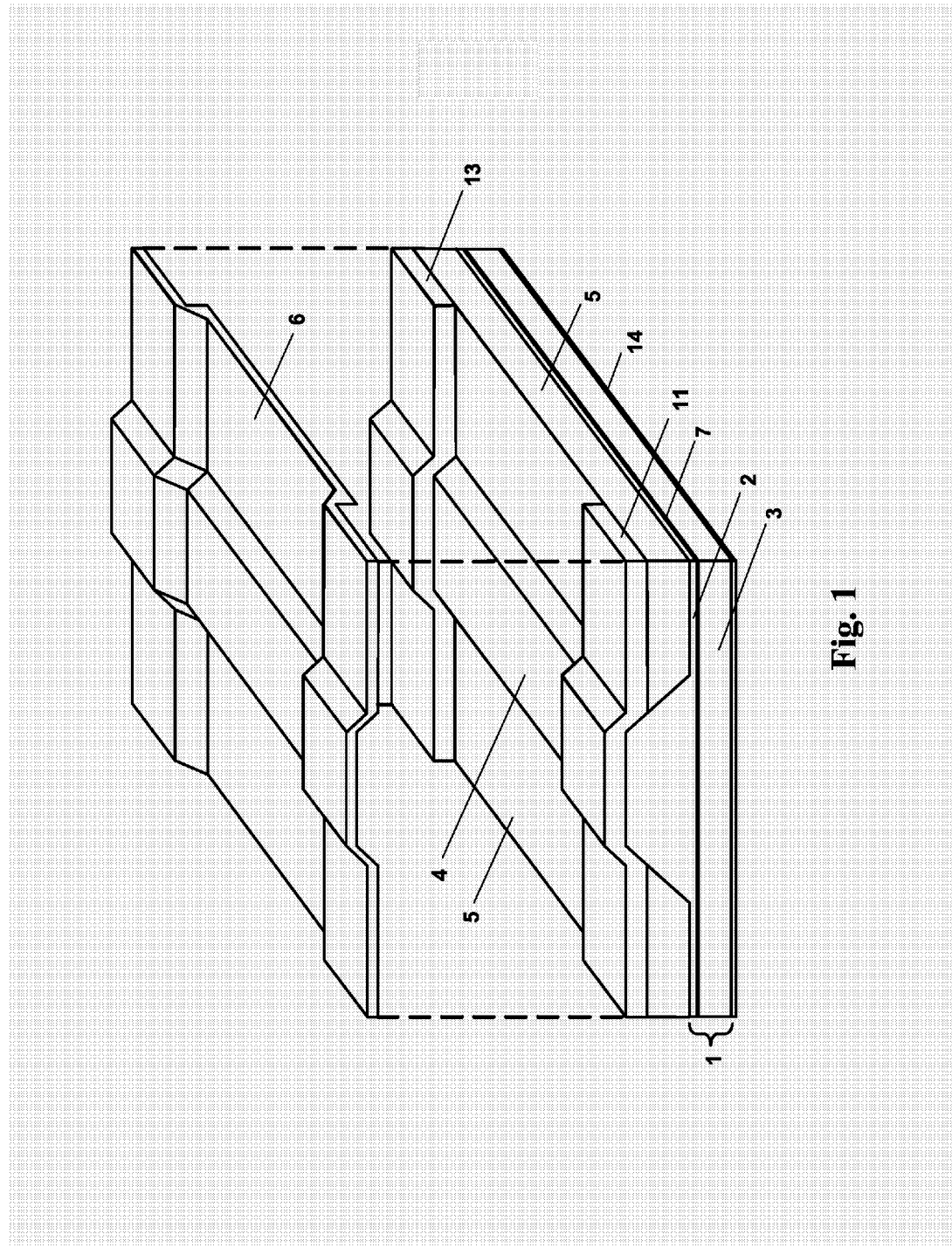

| | | | |
|---|---|---|---|
| 5,032,879 A * | 7/1991 | Buchmann et al. | 257/432 |
| 5,355,424 A | 10/1994 | Idler et al. | |
| 5,844,931 A | 12/1998 | Sagawa et al. | |
| 6,373,875 B1 | 4/2002 | Yu et al. | |
| 6,526,083 B1 | 2/2003 | Kneissl et al. | |
| 6,782,024 B2 | 8/2004 | Schmidt et al. | |
| 6,798,815 B2 | 9/2004 | Schmidt et al. | |
| 2004/0008746 A1 | 1/2004 | Schmidt et al. | |
| 2004/0028105 A1 | 2/2004 | Peters | |
| 2005/0030998 A1 | 2/2005 | Schmidt et al. | |
| 2005/0128557 A1 | 6/2005 | Kim et al. | |
| 2005/0226283 A1 | 10/2005 | He | |
| 2008/0192781 A1 * | 8/2008 | O'Gorman et al. | 372/20 |

OTHER PUBLICATIONS

Great Britain Search Report for corresponding Application No. 0523625.2 dated Mar. 23, 2006.

Chen et al.; "AlGaAs/GaAs Visible Ridge Waveguide Laser with Multicavity Structure"; IEEE Journal of Quantum Electronics; vol. QE-23, No. 8; Aug. 1987; pp. 1283-1286.

* cited by examiner

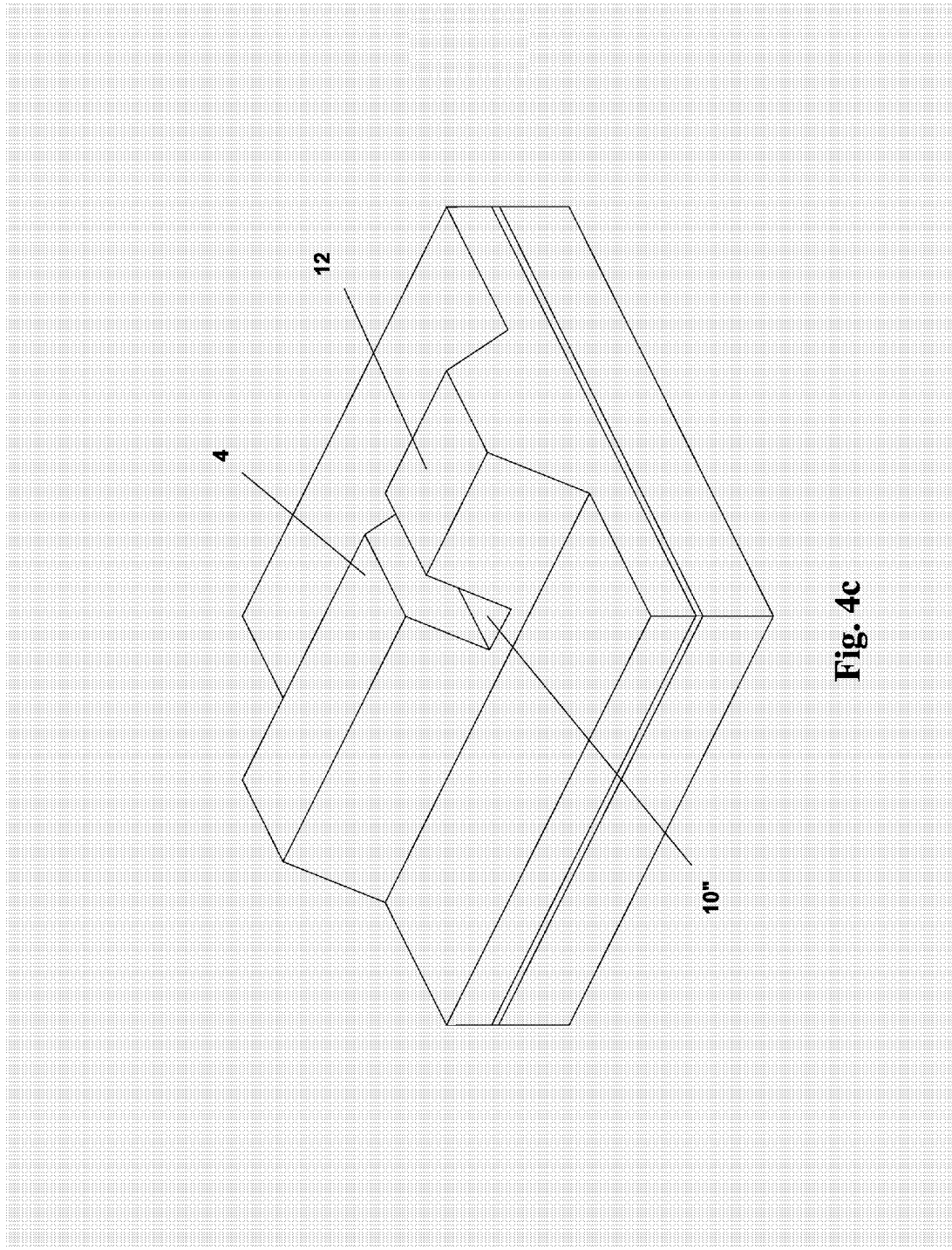

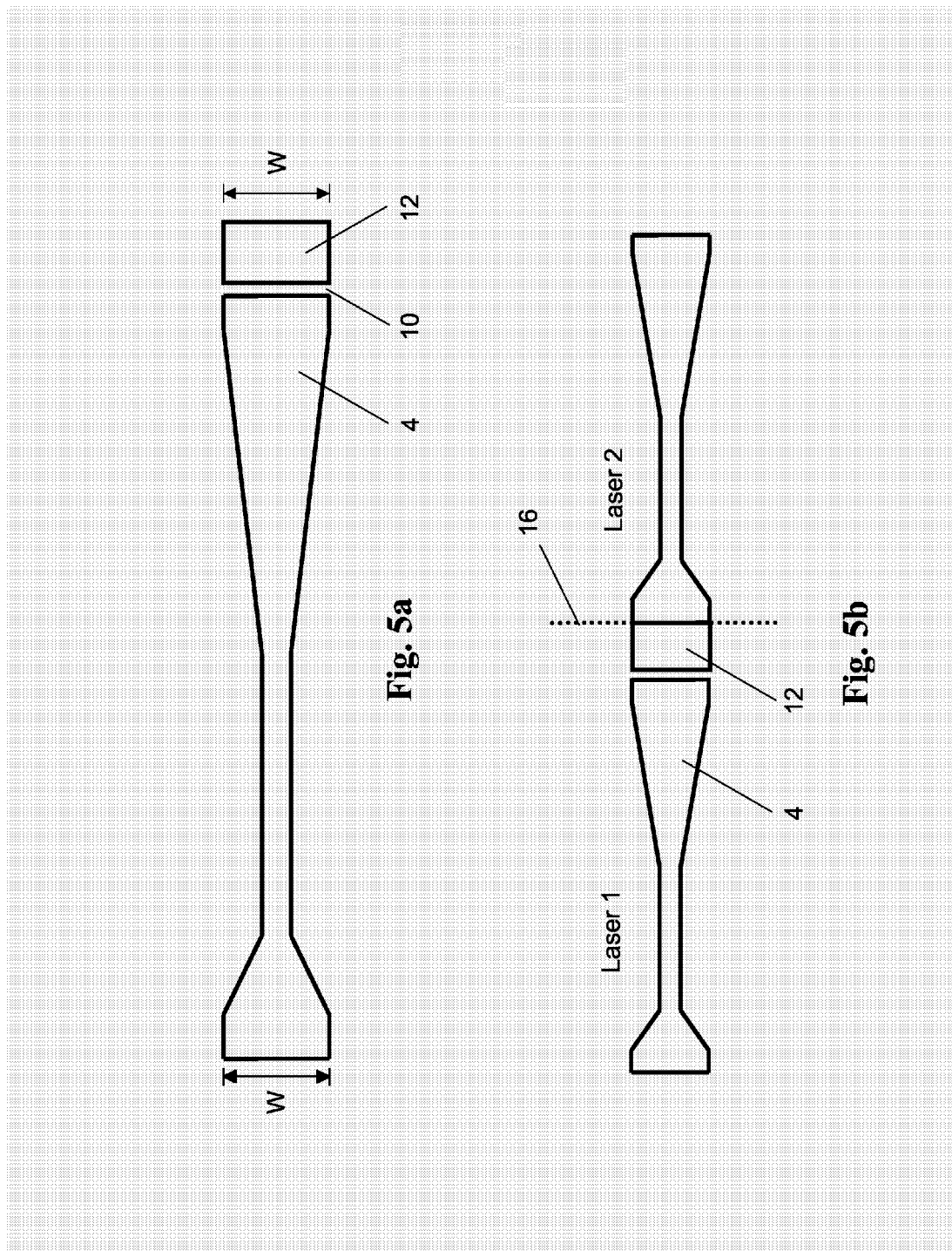

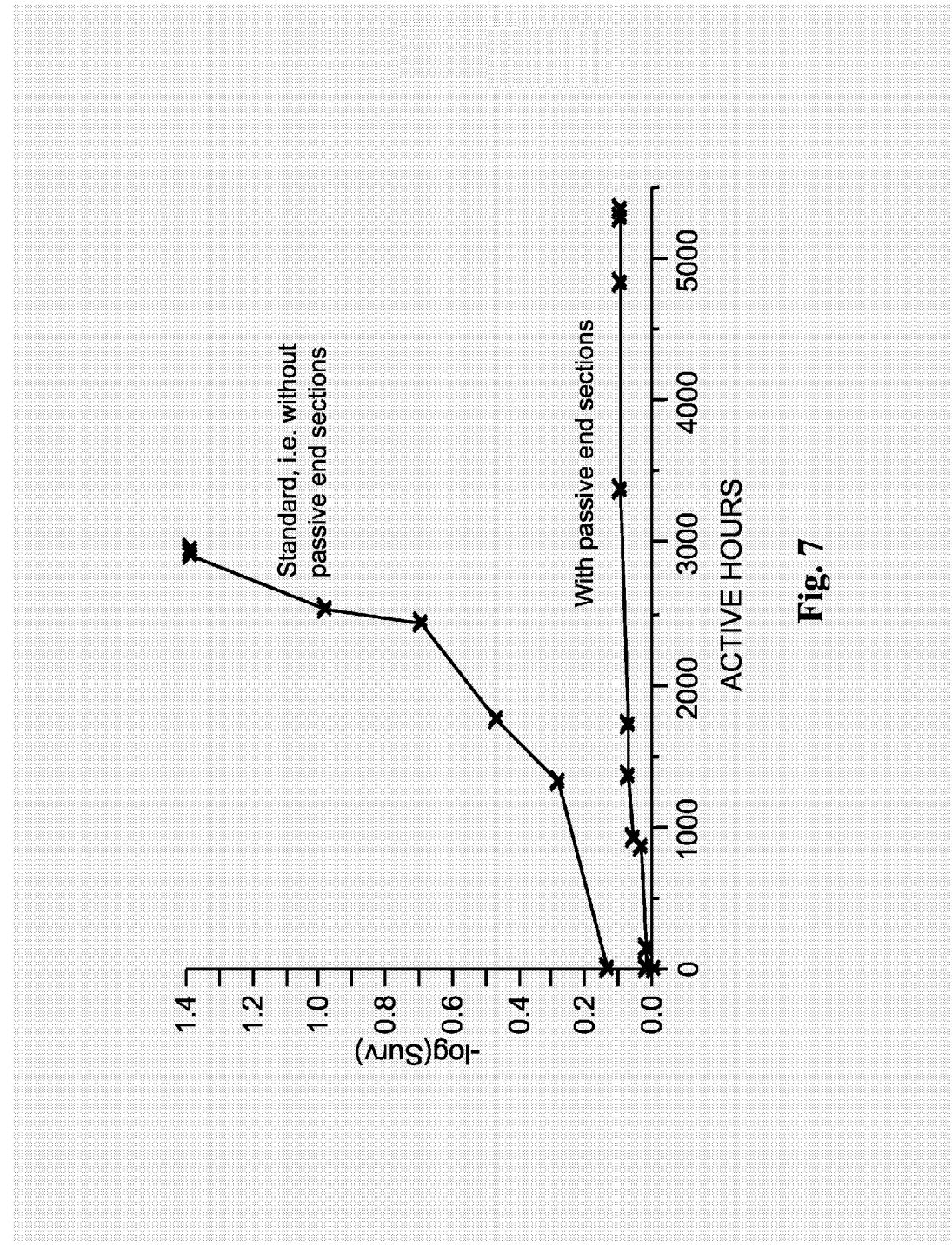

HIGH POWER SEMICONDUCTOR LASER DIODE

FIELD OF THE INVENTION

The present invention relates to semiconductor laser diodes, particularly to AlGaAs-based laser diodes of high light output power. Such laser diodes are commonly used in opto-electronics, often as so-called pump lasers for fiber amplifiers in the field of optical communications systems, e.g. for Erbium-doped fiber amplifiers. Specifically ridge waveguide laser diodes are suited to provide the desired narrow-bandwidth optical radiation with a stable light output power in a given frequency band. Output power and stability of such laser diodes are of crucial interest and any degradation during normal use must be avoided. The present invention concerns an improved design of such laser diodes, the improvement in particular significantly minimizing or avoiding, compared to prior art designs, front facet degradation of such laser diodes at high light output powers. The present invention further concerns an improved design of such laser diodes in which substantially separate electrical control can be applied to a section of such a laser, preferably adjacent to a facet.

BACKGROUND AND PRIOR ART

Semiconductor laser diodes of the type mentioned above have, for example, become important components in the technology of optical communication, particularly because such laser diodes can be used for amplifying optical signals immediately by optical means, thereby avoiding any complicated conversion of transmitted signals along the route between the transmitter and receiver, and thus improving speed and reliability within such systems.

In one specific kind of optical fiber communications system, laser diodes are used for pumping Erbium-doped fiber amplifiers, so-called EDFAs, which have been described in various patents and publications known to the person skilled in the art. Of some technical significance are ridge-waveguide laser diodes with a power output of 150 mW or more, whose wavelengths match the erbium absorption lines and provide low-noise amplification. Several laser diodes have been found to serve this purpose well and are used today in significant numbers.

One of the major problems of semiconductor laser diodes of the types mentioned above is degradation of the waveguide adjacent to a facet, in particular at the front facet of the laser. This degradation is believed to be caused by temperature increase at the mirror facet regions, especially at high power outputs, which temperature increase in turn is probably caused by unwanted carrier recombination in these regions and heating due to free carrier injection.

This is further aggravated by crystal inhomogeneity—often produced by cleaving the laser cavity—and high optical power densities within these regions, especially in the front facet/mirror vicinity. Again, this affects mainly the regions adjacent to the mirrors which are thus the weak points, in terms of reliability.

Particularly in the front facet region, an increased failure rate at high optical output powers has been observed. The same was found, though to a lesser degree, in the vicinity of the back mirror. Since the material degradation in the facet regions is accelerated by a combination of optical power density and electrical current density, it seems advantageous to reduce the latter.

Consequently, ways have been sought to prevent this carrier recombination in the laser diode's facet regions. Such approaches typically comprise providing current blocking regions above the ridge of a ridge waveguide laser, adjacent to the facet.

Schmidt et al. U.S. Pat. No. 6,782,024, assigned to the assignee of the present invention and incorporated herein by reference, is an example of a solution to the above-identified problem. It discloses a semiconductor ridge-waveguide laser diode with means for limiting the injection of carriers at one or both of the diode's end sections, thus providing at least one "unpumped" end section. This injection limiting means comprises an isolation layer which extends at least partially over the end sections and inhibits the injection of carriers from the usual metallization into the active region of the laser diode. Other examples of such approaches are given by Yu et al. in U.S. Pat. No. 6,373,875 and Sagawa et al. in U.S. Pat. No. 5,844,931.

Manufacturing laser diodes according to the designs described above requires processing steps additional to those required to fabricate a basic device in which the whole ridge is covered with an electrode. Such additional processing steps increase the manufacturing complexity and consequently the price of the product. Further, it appears that the above-identified approaches for reducing the current flow through the end sections of the laser diode's ridge, whether by placing an insulating stripe over the end of the ridge as in U.S. Pat. No. 6,782,024 or by patterning an electrode such that it does not extend over the end section close to the facet as in U.S. Pat. No. 6,373,875 or U.S. Pat. No. 5,844,931, above, do not completely prevent current from spreading into the end sections.

Thus, there is a need for a simple and reliable design for a high power ridge waveguide laser diode which does not suffer from end section degradation.

In making such a laser diode there is also a need to avoid adding to the complexity of the laser diode structure and to keep the number of additional structural components or manufacturing steps of the laser diode at a minimum. Such a manufacturing method should be more economical than those described in the prior art, allowing reliable mass production of ridge waveguide laser diodes.

THE INVENTION

According to the present invention there is provided a semiconductor ridge waveguide laser diode including a semiconductor body, a ridge on a surface of the semiconductor body defining a waveguide between first and second facets, a first electrode on the ridge for injecting carriers into the laser diode, a second electrode located on a surface of the semiconductor body opposite to the surface having the ridge, characterized in that the ridge comprises a plurality of regions, including a main ridge section and a separate ridge section, separated by a physical separator, such as a trench, passing through at least a part of the height of the ridge.

In brief, to address the issues addressed above, in a first embodiment, the present invention provides a ridge waveguide laser diode with a passive section of the ridge waveguide by providing a trench or gap between at least the active main section of the laser diode ridge (i.e. the main ridge section) and a separate smaller part of the ridge adjacent to a facet of the laser diode (i.e. the separate ridge section). The drive electrode on the main ridge section does not extend to cover the separate ridge section, which consequently forms a passive separate ridge section, i.e. a section into which substantially no current spreads. Two trenches, one towards the front facet and one towards the rear facet, may be provided if it is desired to provide two passive separate ridge sections.

The invention also concerns an appropriate manufacturing process for making such a trench by etching it into the ridge waveguide of a high power laser diode.

The result is a very high power laser diode with a reduced susceptibility to failure, in particular by substantially eliminating any current density in the separate section of the ridge waveguide adjacent to the end facet, due to current injection through the electrode on the main ridge section, thus displaying increased reliability compared with prior art devices. The increased device reliability is due to the novel "separate ridge section" design, which differs significantly from the known unpumped end section design.

Whilst the physical separator is preferably a trench empty of solid material, the entire ridge, including the trench, may be overgrown by solid material in the case where the device is a buried ridge device. Alternatively passivation material may be grown in the trench. The key feature is that the physical separator provides a refractive index contrast, and, although the greatest contrast would be provided by a semiconductor-air boundary, the use in the physical separator of a dissimilar overgrowth material may still provide a sufficient though reduced contrast.

In an embodiment of the present invention a trench or gap is etched across the width of the laser's ridge, either as part of the ridge etch process, or as a separate etch step, resulting in a passive ridge waveguide end section, i.e. an end section into which substantially no current can diffuse. The result, as mentioned above, is a pump laser chip with minor impact on the electro-optical performance, but with highly improved reliability.

Ideally substantially no current spreads into the main body of the device, but in practice the current may simply be reduced to a low level. Without the trench, if the control electrode simply stopped short of the facet, the current density profile along the ridge would tail off adjacent to the facet, but to a lesser extent than would be the case if such a trench were provided. Preferably the trench cuts through the top contact layer of highly doped semiconductor material, that is typically present, and into the less conductive, less highly doped region of upper cladding beneath. This cutting through of the contact layer has a disproportionate effect on reducing the current flow into the separate ridge section.

In addition to the reliability improvement, the separate ridge section may act as a spatial mode filter, i.e. a filter generating higher absorption losses for higher order optical modes. This is due to both the trench and the passive separate ridge section, in the case that the ridge of the end section is narrower than that of the main body of the ridge, and thus reduces the negative impact of non-Gaussian or non-centered light reflected back from the output facet or coupled back into the ridge waveguide, e.g. from a fiber Bragg grating.

Furthermore the separate section of the ridge waveguide may be shaped in different ways, which, since no current is injected from the electrode on the main ridge section, removes a significant design limitation for this section of the ridge waveguide. The novel technology can be applied to narrow stripe laser diodes as well as to broad area semiconductor laser diodes. Possible design variations are shown in the appended drawings and described in the following sections of this specification.

To summarize, in one embodiment, a ridge waveguide laser diode structured according to the present invention provides a substantially separate ridge section, which exhibits a significant improvement over prior art laser diodes with partially unpumped end sections, especially with regard to its long-term stability and reliability. At the same time, a laser diode according to the invention may also provide an increased power output compared to a prior art design. Further, it may be possible to reduce the size of such a novel laser diode and still provide the same or even an increased output.

This significant improvement may be effected by just a minor increase in manufacturing complexity so that conventional manufacturing equipment may be used and usual manufacturing processes may be applied. Also, the laser diode itself may have approximately the same dimensions as before, thus avoiding any packaging changes or problems.

As briefly mentioned above, the design idea of one or two separate ridge section(s) adjacent to the end facets of a ridge waveguide laser diode serves to reduce carrier concentration close to the facets. As explained before, because of the crystal inhomogeneity that is often produced by cleaving the laser cavity and high optical power densities, especially in the front facet/mirror vicinity, the regions adjacent to the mirror are usually the weak points in terms of reliability. Here, the invention provides a solution by establishing one, two or more separate, passive ridge section(s), thus significantly reducing the failure rate at very high optical output powers, particularly in the front facet region.

In another embodiment of the present invention there is a control electrode provided on the separate ridge section of the ridge waveguide laser diode. The advantage of providing such an electrode is that separate electrical control may be applied to the separate ridge section of the laser, since the trench substantially prevents current through said section from spreading into the main body of the device.

The invention is not limited to high power laser diodes, but is applicable to any ridge waveguide laser diode, e.g. to narrow stripe or broad area laser diodes with a ridge waveguide structure. The person skilled in the art will know how to modify the details given below to adapt the present invention to such other laser diodes.

DETAILED DESCRIPTION OF PREFERRED EMBODIMENTS AND A PROCESS

Figure 2:
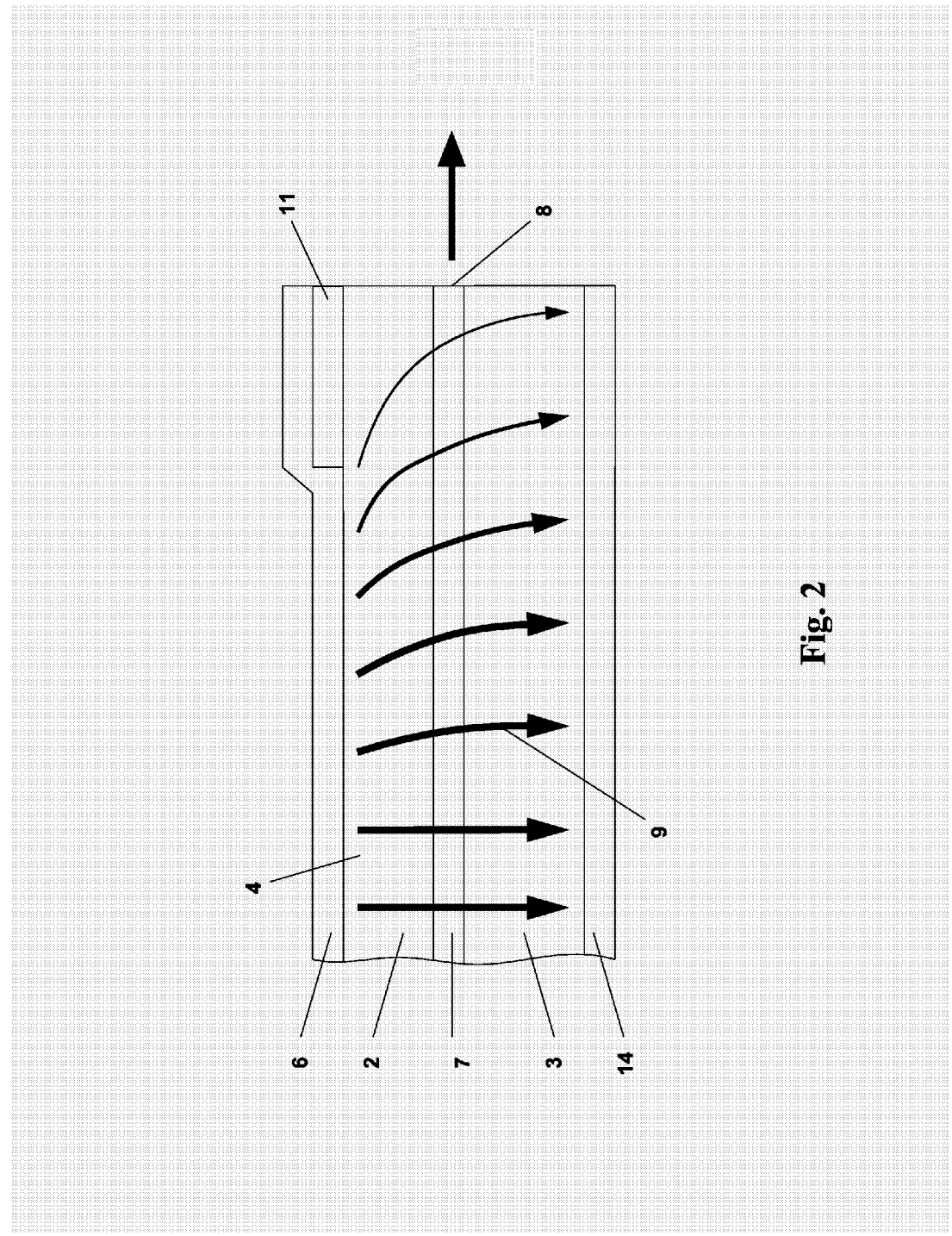
Figure 3:
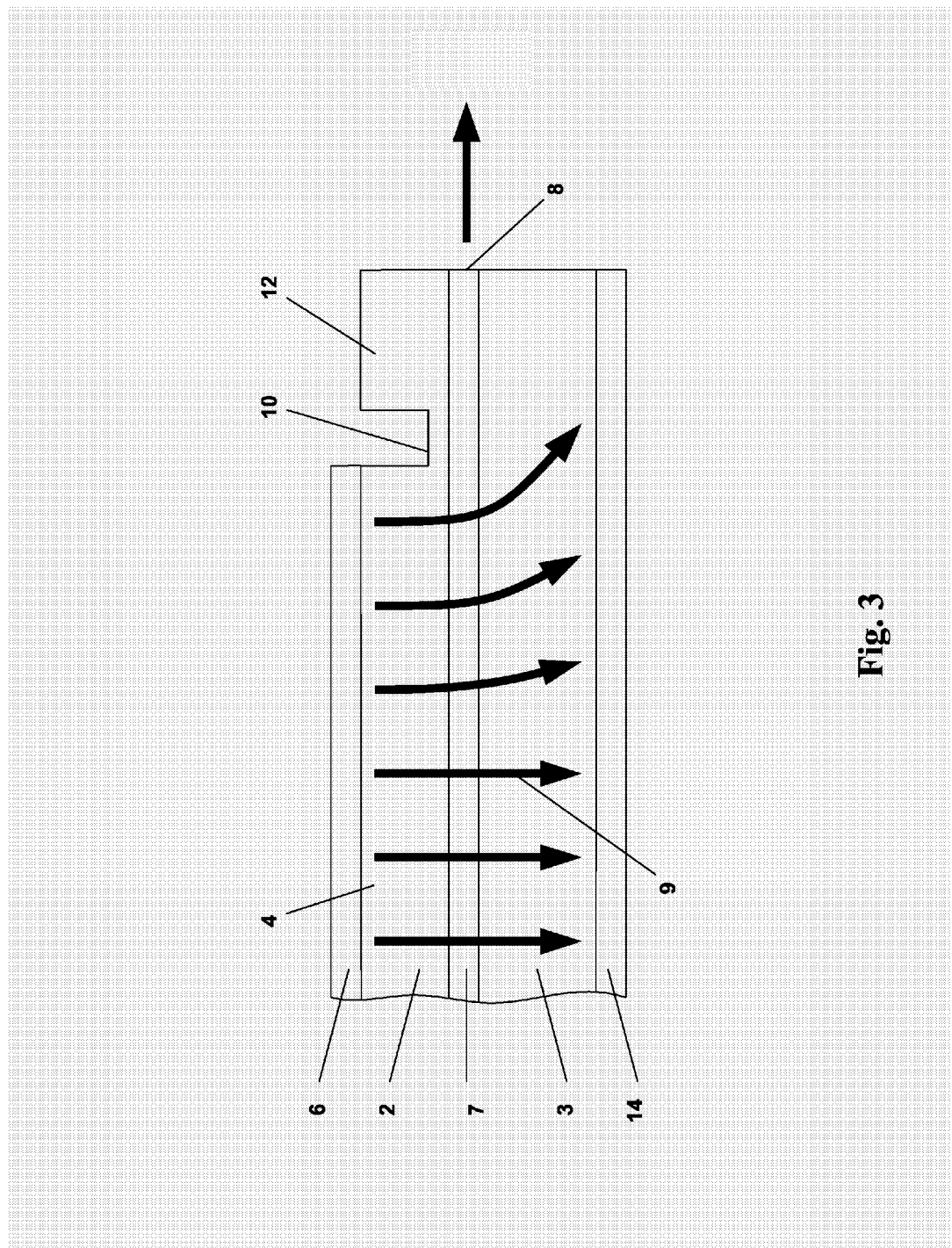
Figure 6:
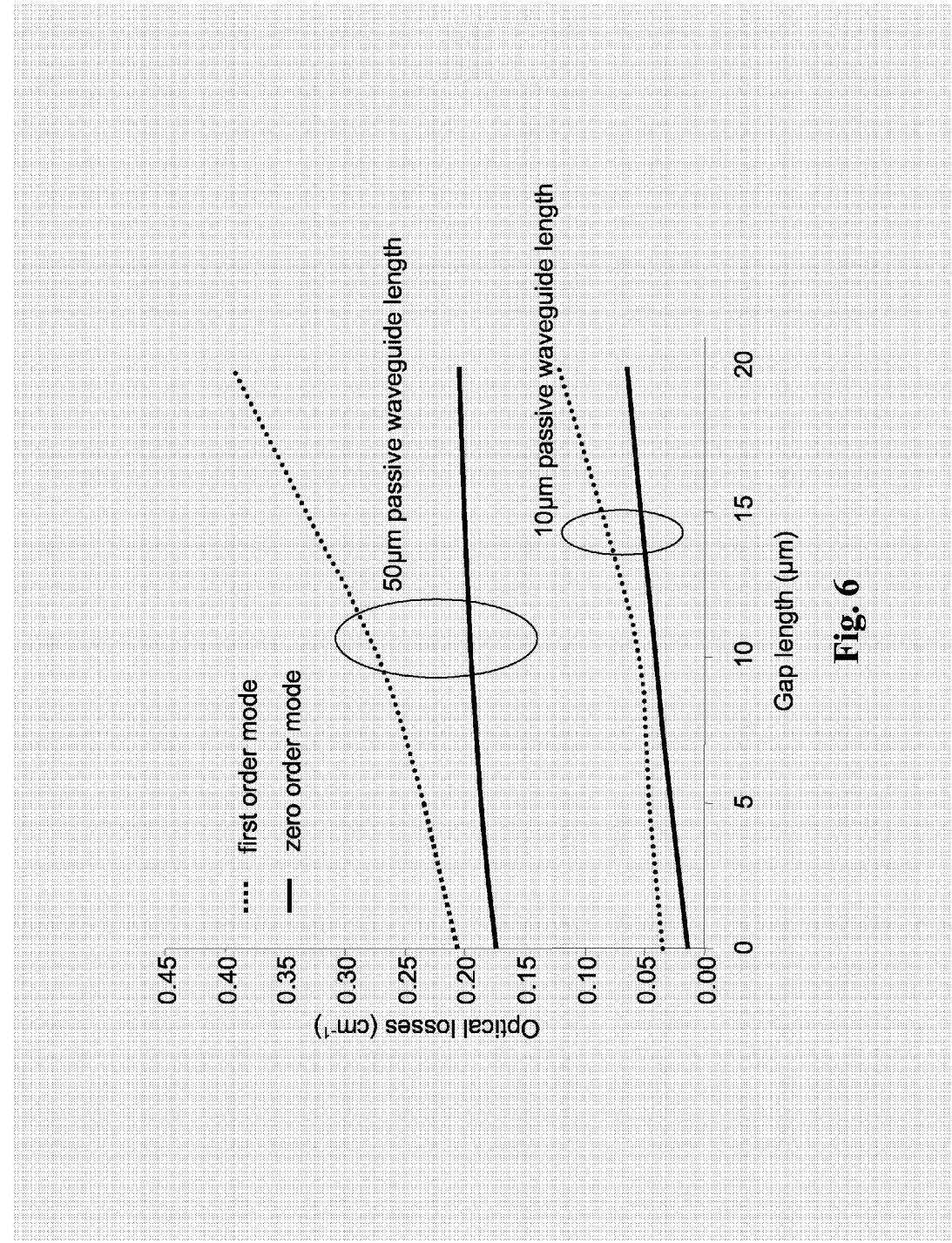

In the following, several embodiments of the invention shall be described by way of example only and by reference to the drawings, which illustrate in:

FIG. 1 a schematic, perspective, "exploded" view of the structure of a prior art ridge waveguide laser diode;

FIG. 2 the current distribution in a schematic cross section of a prior art ridge waveguide laser diode, adjacent to the front facet;

FIG. 3 the current distribution in a schematic cross section of a ridge waveguide laser diode according to the present invention, adjacent to the front facet;

FIGS. 4a-4h schematic, perspective views of several laser diodes according to the present invention;

FIGS. 5a, 5b a schematic plan view of the use of the invention in a specific design of a cleaved laser;

FIG. 6 a graph showing simulated losses for the zero order mode and the first order mode of a laser diode according to the invention; and FIG. 7 a graph comparing failures of a prior art laser diode with failures of a laser diode according to the invention.

Generally speaking, the invention aims to reduce the local current density within the laser's end sections to reduce the degradation caused and accelerated by local heating of the laser.

The local current in the end section of a prior art laser is—as is the current in other parts of the laser diode—substantially generated by the injection current driving the laser diode. Thus, to reduce the local current density and to prevent current flow within the laser diode's end sections, the current injected into these end sections must be reduced. Various processes have been tested, including contact lift-off, removing the contact by etching, or otherwise interrupting the contact around these regions. However, many of the processes tested and realized failed due to material, processing, or reliability problems or were just too complicated to be commercially viable.

Until now, the most successful approach was an "isolation layer" process to achieve the desired unpumped end sections. This approach differs from earlier ones in the way that an additional thin isolation layer is placed between the semiconductor contact layer and the metal contact at the laser diode end sections.

The design of an exemplary laser diode structure according to the prior art is shown in FIG. 1, depicting an AlGaAs ridge waveguide laser diode in a perspective and partially exploded view. This 980 nm pump laser diode consists of a SQW (strained quantum well) active region 7 sandwiched by two AlGaAs cladding layers 2 and 3. The top electrode 6 covers the semiconductor ridge 4 together with the embedding material 5. At the bottom of the body 1 is an n-metallization 14. The additional isolation layers 11, 13, here made of SiN, are located between the top metallization 6 and the AlGaAs active region layer 2, and extend across the ridge 4 adjacent to the end facets.

The unpumped end section is established by careful alignment of the additional isolation layers 11 and 13, respectively, on top and around the ridge 4. As shown, the isolation layers 11 and 13 may extend laterally over the whole width of the semiconductor body 1. They are formed in a separate process, wherein an applied isolation layer is patterned using a lithographic mask process and an etching step, after definition of the further, lateral isolation layers 5 as self-aligned layers around the ridge waveguide on top of the semiconductor body 1. Thus any of the isolation layers 11 and 13 may be of different thickness and/or material as compared to the further isolation layers 5.

Extending any of the about 30 nm thick isolation layers 11 and 13 over the whole semiconductor body width simplifies the alignment process for the isolation layer patterning. It also improves the facet cleaving quality during the bar separation process.

The electrode 6 covers the whole device and provides the driving current for the laser diode.

The person skilled in the art knows that some parts of a functioning laser diode are not shown in FIG. 1, e.g. the front and rear mirror coatings, the leads providing the current to the electrodes, i.e. the electrodes 6 and 14, etc. But these parts are rather standard and are not shown here for the sake of clarity.

FIG. 2 shows schematically the current distribution along a vertical cross section along the length of a prior art ridge waveguide laser diode according to FIG. 1, i.e. with an unpumped end section. An isolation layer 11 is provided between the top metallization 6 and the ridge 4 adjacent to the end facet 8, and thus produces a current distribution approximately as indicated by the arrows 9. The laser light exits the front facet 8 of the laser, and is depicted by an arrow. The remaining parts are equivalent to those shown in FIG. 1.

FIG. 3 shows, again schematically and in the same scale as FIG. 2, the basic concept of the invention. A trench (or gap) 10 separates the active, main ridge section 4, which comprises the main body of the ridge and is covered by the top metallization 6, from a passive, separate ridge section 12. The physical separation between the two ridge sections results in a significantly changed current pattern, as indicated by the arrows 9, in which there is substantially no current flowing through the region of the laser diode adjacent to the facet.

The person skilled in the art will recognize that this trench 10 may be arranged at the laser's front facet, or at the laser's rear facet, or at both ends of the laser. Further, the gap may be modified in its depth, its width, its form, or all of them to suit the desired effect. Even further, modification of the separate ridge section 12 regarding its length, its width, or its shape may be advisable, as will be shown and explained, below.

Figure 4A:
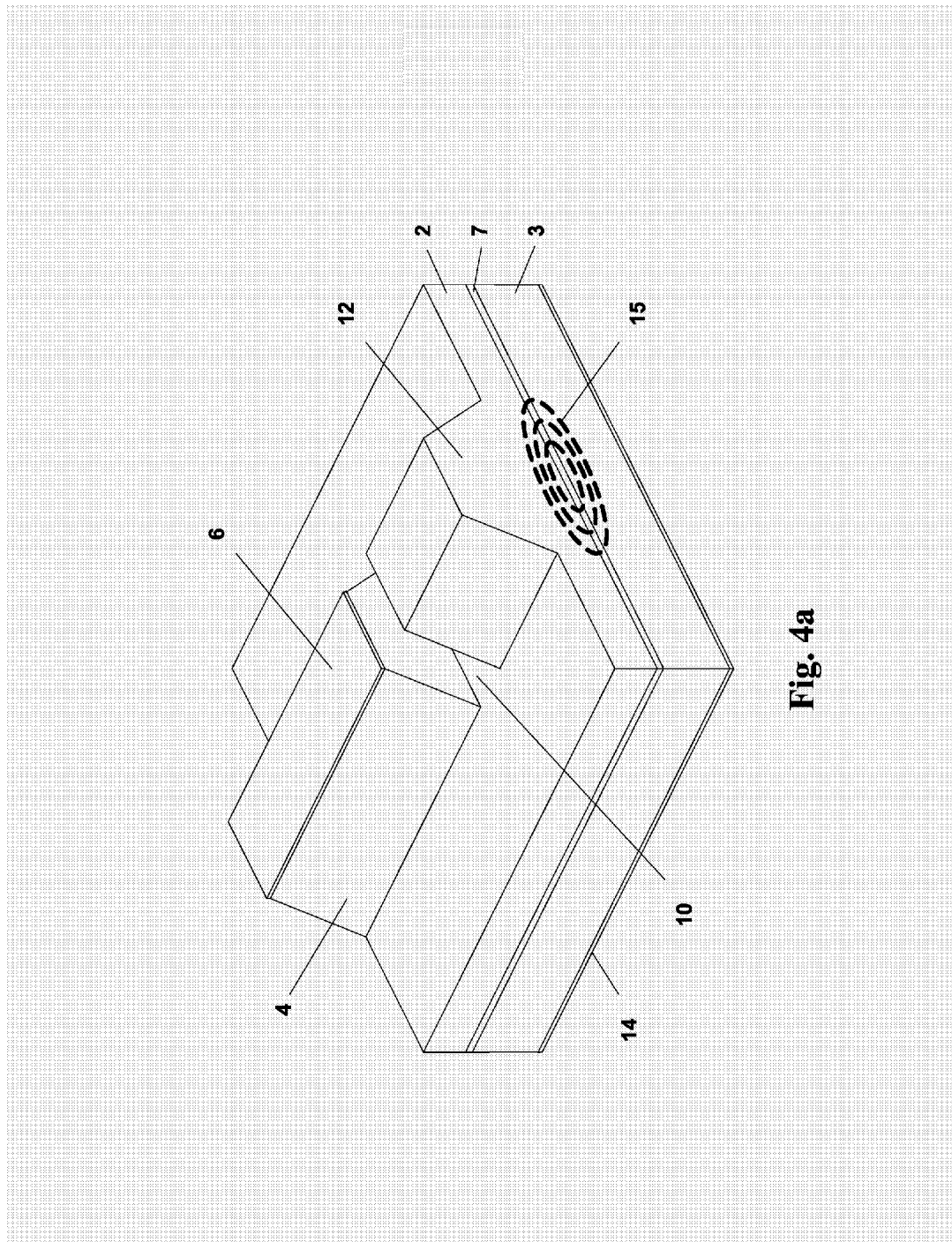
Figure 4B:
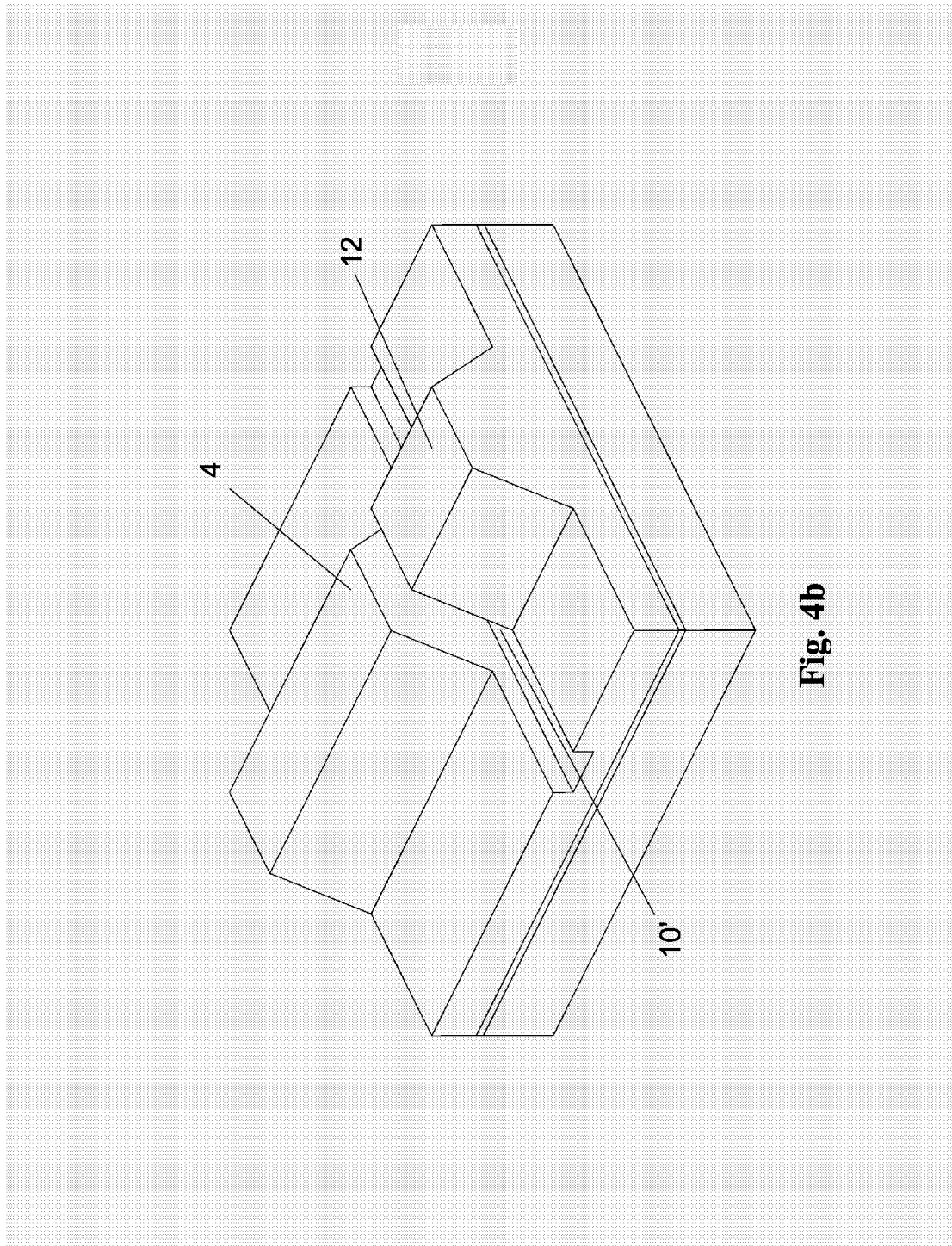

FIG. 4a shows a perspective view of a ridge waveguide laser diode according to a first embodiment of the present invention (which corresponds with the cross section shown in FIG. 3) in which a passive, separate ridge section 12 is separated from an active ridge section 4 by trench 10. Electrodes 6 and 14 are provided on the active main ridge section 4 and the substrate surface opposite to the ridge respectively for supplying a drive current to the laser diode. Light is created due to optical gain and shown by optical mode 15. Passive, separate ridge section 12 has the same width and form as the active main ridge section 4. In one embodiment the trench 10 is etched to a depth equal to the height of the ridge above the adjoining surface, and may advantageously be etched in the same etch step as the ridge. In alternative embodiments the trench 10 is etched in a different etch step to the ridge, and may be etched more or less deeply, as is illustrated in FIGS. 4b and 4c respectively, from which the electrodes 6, 14 have been omitted for clarity (similarly from FIGS. 4c, 4d and 4e).

Figure 4D:
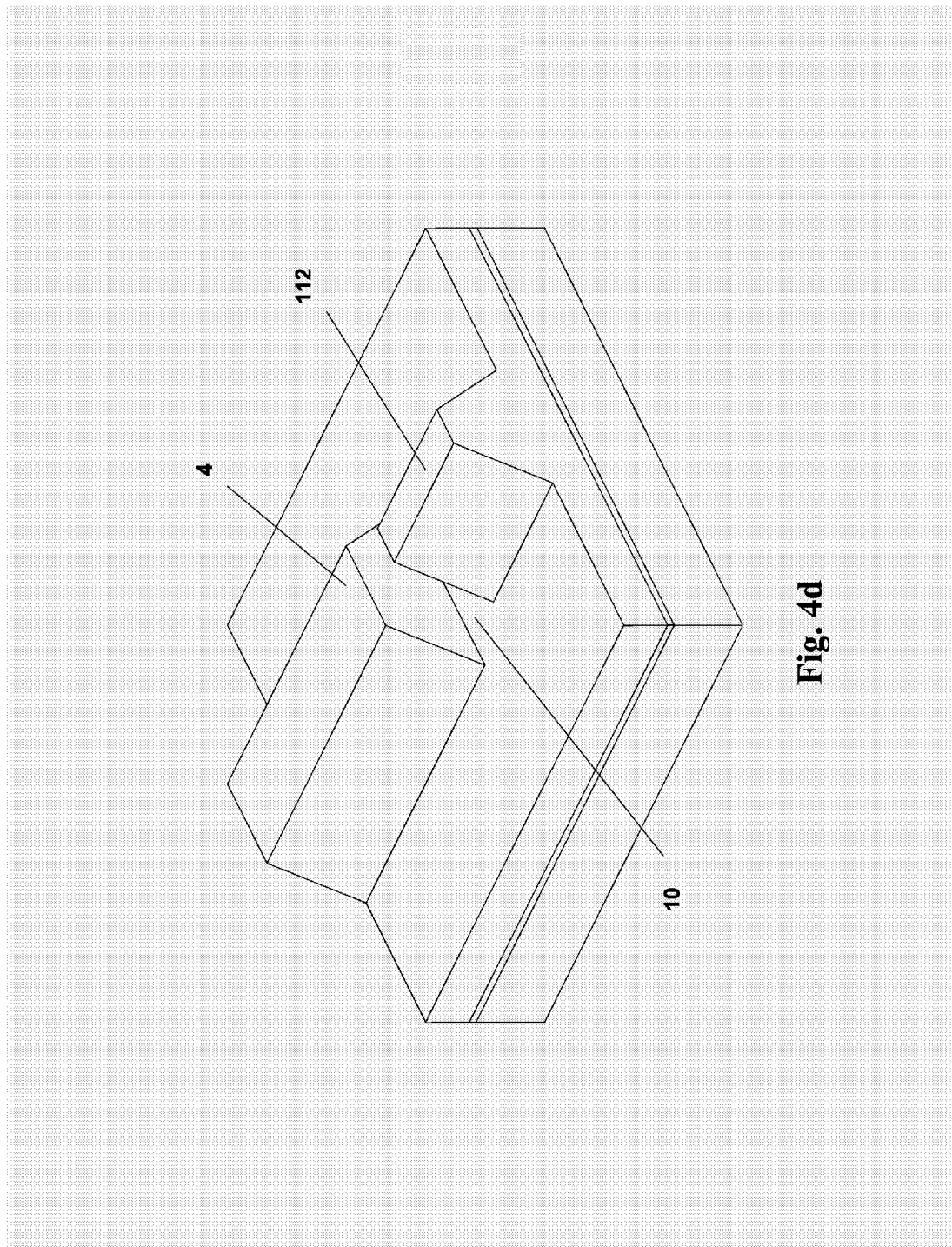

FIG. 4d shows a laser diode that is similar to that of FIG. 4a, except that the passive ridge end section 112 is narrower than the active main ridge section 4. Such a design may advantageously provide spatial filtering, which has particular application in the case of a single mode laser diode by suppressing higher order optical modes preferentially, relative to the fundamental optical mode.

An exemplary width of the active main ridge section 4 for a typical single-mode, narrow-stripe laser diode is around 5 µm. The narrowed passive end section 112 may have a reduced width of about 3-4 µm. In a multi-mode laser diode, the active ridge is usually wider, e.g. up to 200 µm. Usually, there is no need for a narrower passive, separate ridge section 112 for such lasers, although it is a possibility.

As an alternative to the passive end section being narrower than the active main ridge section as described above with reference to FIG. 4d, the passive end section may be higher or lower than the active main ridge section (not illustrated).

In practice the preferred design is a narrower separate ridge section, which provides spatial filtering of higher order modes, in the preferred case of a single mode laser. Higher order modes have a wider lateral extent, and so lateral features that introduce loss provide a larger effect on higher order modes than on the fundamental mode. The reduction in ridge width of the separate section 112 of FIG. 4d will preferentially laterally 'clip' the tops (for a weakly guiding waveguide) of any unwanted higher order modes. Even quite modest increases in optical loss can be adequate to help differentiate between modes and ensure that the laser lases on the fundamental mode.

Ridge sections with different widths can be easily incorporated into a design, simply by changing the width of the features that define the ridge width on the corresponding lithographic mask. Thus dissimilar ridge widths can be introduced without introducing extra processing steps (although the addition of the trench etch typically introduces extra processing steps, unless it is also incorporated into the mask that defines the ridge widths, which produce a trench of the same depth as the ridge height).

It should be appreciated that, although each of the ridge sections described above is of constant width and height along its length, it is also within the scope of the invention for the width and height of the section to vary along along its length, for example by being evenly tapered in height or width along its length. In this case the mean width and height of the ridge sections may be compared. Spreading or constriction by tapering is ideally adiabatic, but in practice will typically introduce a small amount of unwanted mode conversion. Since light in a laser cavity moves in both directions along the waveguide, it experiences both spreading and constriction.

Figure 4E:
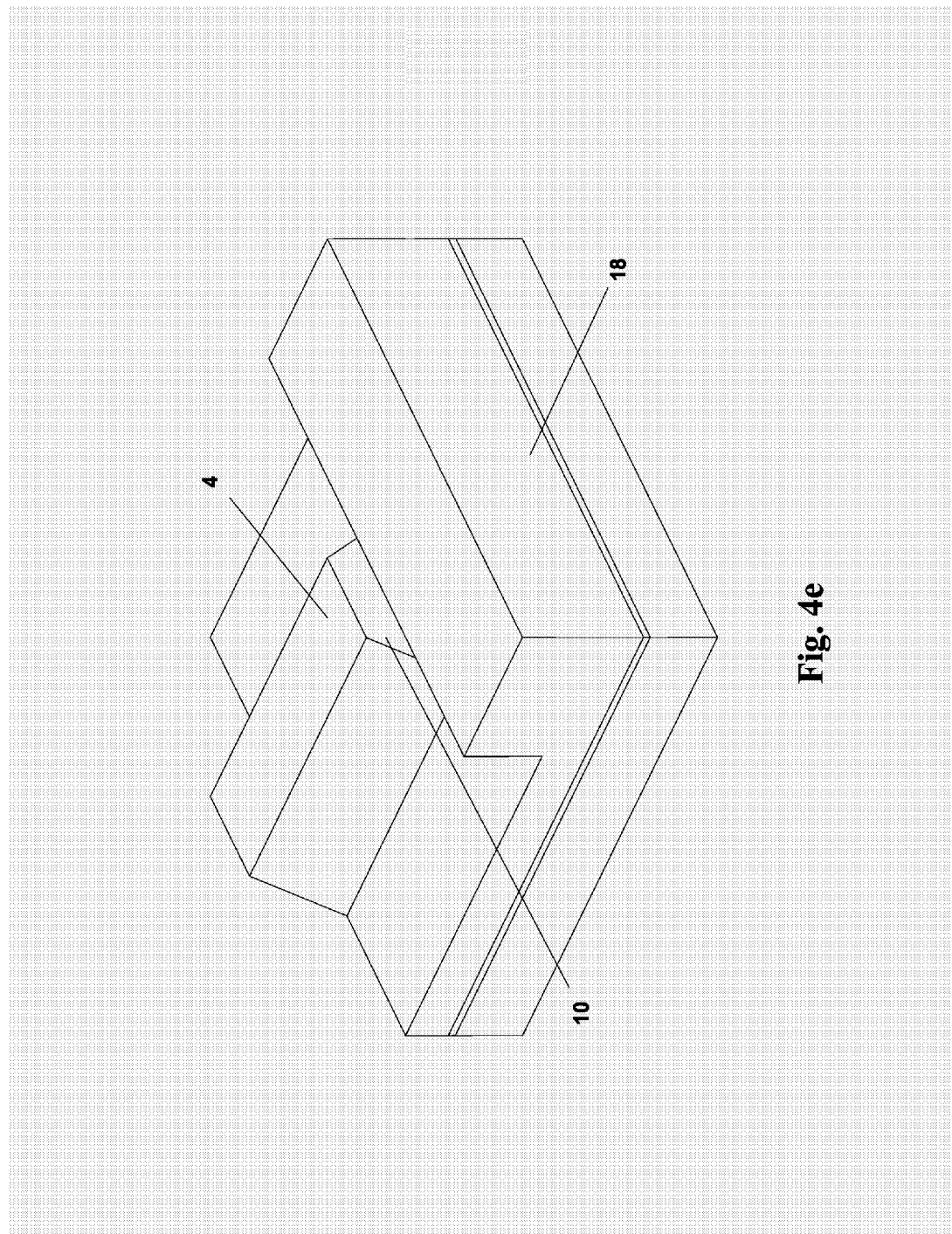

In another embodiment, the separate ridge section 12 may be wider than the ridge of the active main ridge section 4. If, e.g., an improved cleaving quality is desired and/or the dispersion of the beam is less important for a specific application of the laser diode, the width of the passive end section may even be a multiple of the width of the active main ridge section 4, both for single-mode or multi-mode laser diodes, respectively. Such a design is shown in FIG. 4e.

Figure 4F:
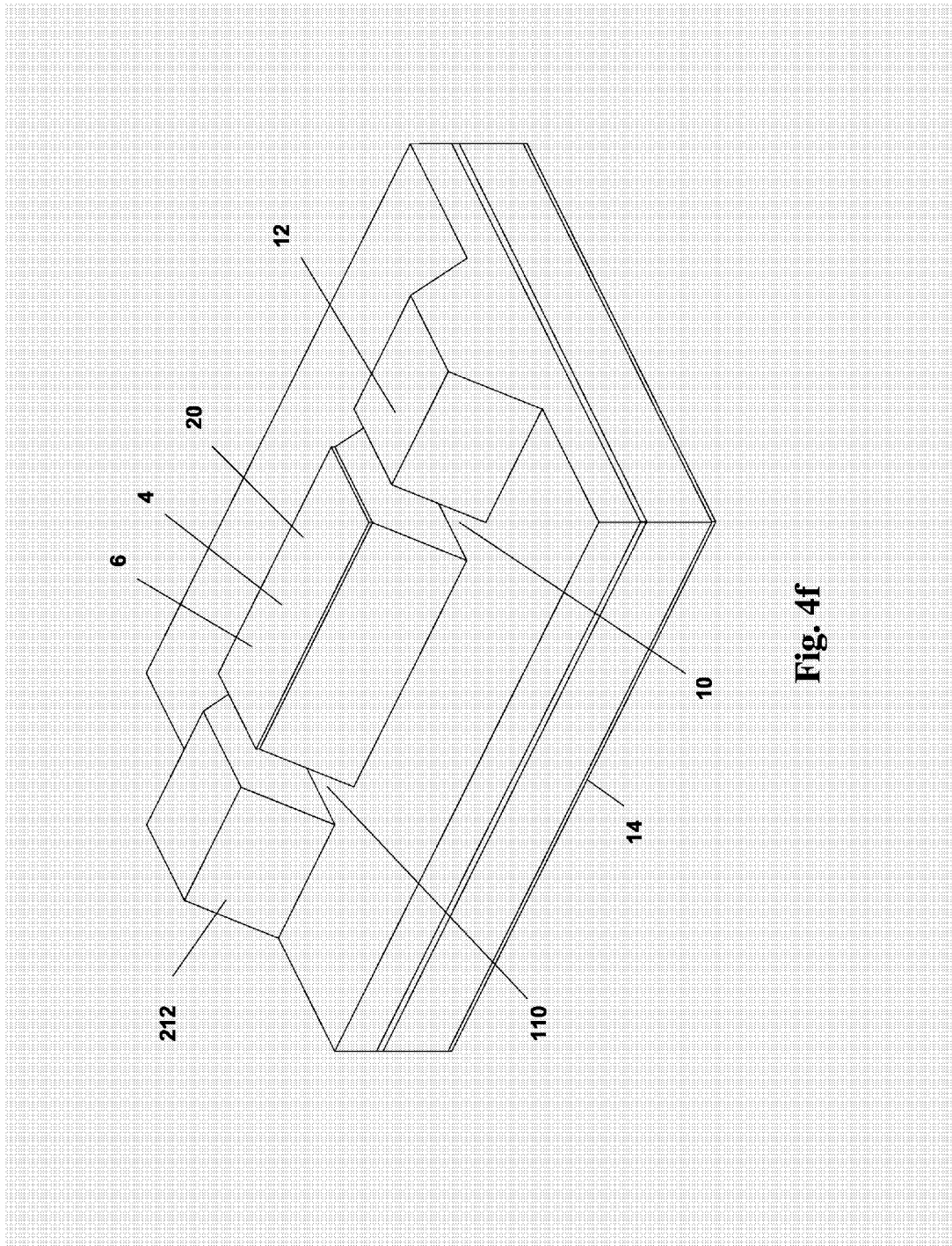

In a further embodiment of the invention, the laser diode may have separate sections 12, 212 adjacent to each end facet and separated from the active main ridge section 4 by respective trenches 10, 110, as is shown in FIG. 4f.

Figure 4G:
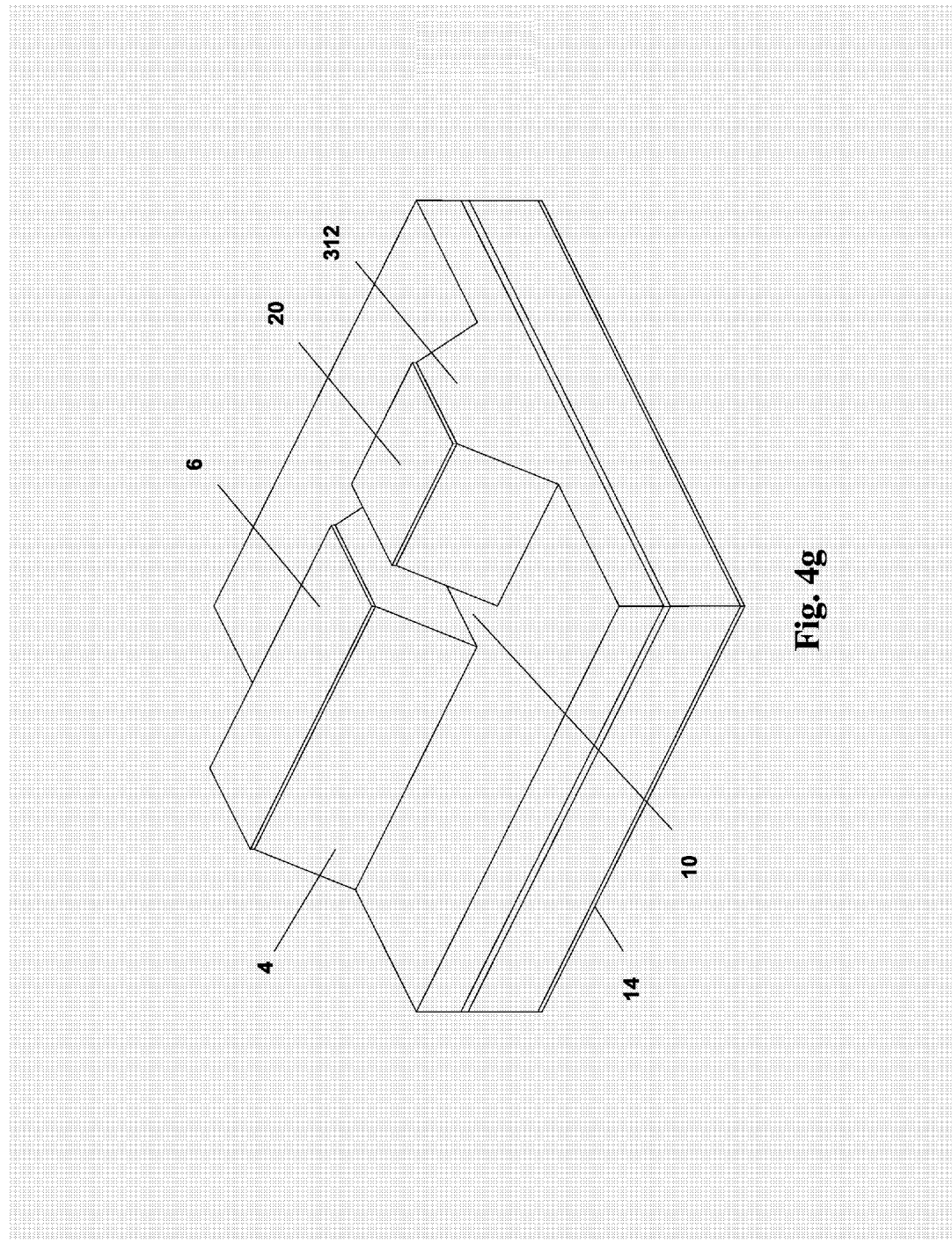

FIG. 4g shows an embodiment of the present invention in which a trench 10 separates the active main ridge section 4 from an end section 312, on which there is provided a control electrode 20 to supply current to the separate ridge section 312. The trench 10 enables substantially independent control of the currents in the active main ridge section 4 and end section 312. The control electrode 20 may be electrically connected to electrode 14 or reverse biased with respect to the bias applied to the active main ridge section 4 by electrodes 6 and 14, e.g. to further reduce any low level current that may be flowing through the active layer 7 within the section of the waveguide beneath separate ridge section 312, resulting in potential further benefits to reliability and waveguide stability. In a further embodiment, the control electrode 20 may be forward biased at a lower level than electrode 6, with respect to electrode 14, such as to produce optical gain in the separate section 312. In a yet further embodiment, the end section electrode 20 may be biased such that the laser diode operates in a manner that is self-pulsing.

Figure 4H:
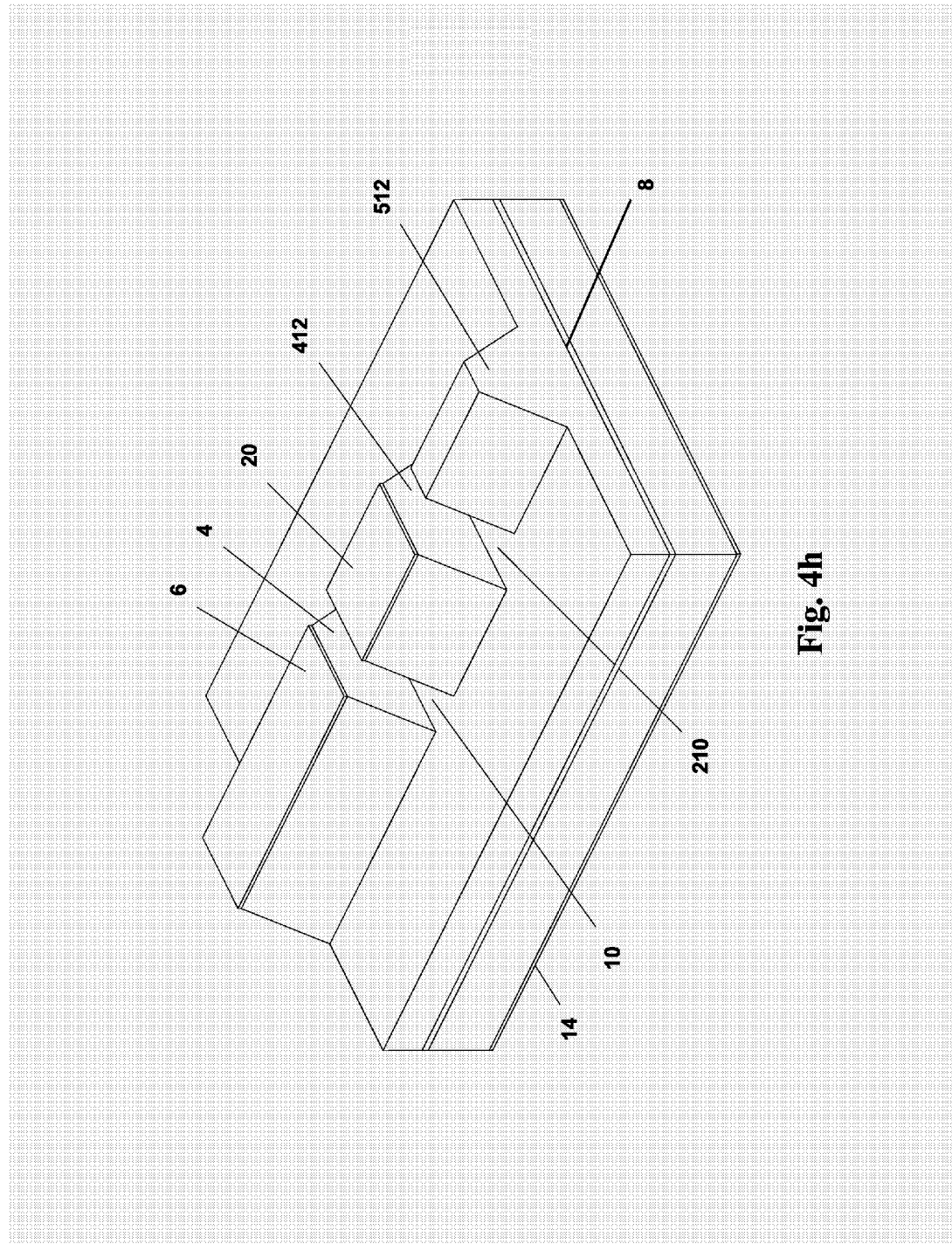

In a further embodiment of the present invention, a plurality of separate ridge sections are provided between the main active ridge section 4 and an end facet 8, of which one section is narrower to provide spatial filtering. FIG. 4h shows such an embodiment, in which an active separate ridge section 412 and a passive separate ridge section 512 are separated from the active main ridge section 4 and each other by two trenches 10, 210, the spatial filtering being provided by the separate ridge section 512 adjacent to the facet. Alternatively, or additionally, the neighbouring separate ridge section 412 could be narrower to provide spatial filtering. Any or none of the separate ridge sections may be provided with a control electrode.

The separate ridge sections shown in FIGS. 4a-h have the same length, but this need not to be the case. The length of a separate ridge section may be up to 500 μm. In the case that the laser diode is provided with a passive, separate ridge section the desired balance between the optical loss in the passive separate ridge section versus the desired output of the laser diode determines the length of the passive ridge section, either alone or in combination with any of the measures described above.

An exemplary trench length (i.e. the distance between the active main ridge section 4 and a separate ridge section, e.g. 12) is between 2 and 100 μm, and preferably between 5 and 20 μm. Trench lengths down to 5 μm can be easily manufactured by wet etching. Shorter trenches, e.g. down to 2 μm, may be manufactured by dry etching.

The trenches (e.g. 10, 110) are shown in FIGS. 4a to 4h as having the same length. However, by modifying the trench length the dispersion of the optical beam exiting the laser diode is affected. Typically, a greater gap length reduces the percentage of the zero order optical mode coupled into the separate ridge section(s). The upper limit however is determined by the desired efficiency and stability of the laser diode, since optical losses increase with increasing trench length.

The invention is applicable to all high power semiconductor laser diodes and is independent of the base material used, e.g. InP, GaAs, GaN, GaSb, etc. The only requirement is that the internal losses of the base material are approximately 1-2 $cm^{-1}$, or less.

FIGS. 5a and 5b show an example of a single-mode semiconductor laser diode design which, as will be shown, is particularly suitable for implementation of the present invention. Schmidt et al. U.S. Pat. No. 6,798,815, incorporated herein by reference, discloses the details of this design and its manufacture, which includes the step of cleaving separate lasers from a length-wise bar of repeating structures.

A laser diode according to Schmidt et al. U.S. Pat. No. 6,798,815 is usually manufactured by placing and processing several hundred laser diodes on a semiconductor waver. All laser diodes are identical and oriented in the same direction end-to-end all over the wafer.

Assuming that a passive, separate ridge section 12 according to the invention is to be added to only one end of each laser diode, here the front end where the laser beam exits, the known design is modified by producing a passive ridge section 12 on the wafer, separated from the main active ridge section 4 according to the invention by the trench 10. This is shown in FIG. 5a for a single laser diode, which is representative of the repeating design on a whole wafer. FIG. 5b shows two laser diodes and the line 16 along which these two laser diodes are divided by cleaving. A separate ridge section may be used that is tapered, and is narrower in such a way that it provides spatial filtering, and yet has the same width at the output facet as the main ridge section. This has the advantage of ease of manufacturing, so that devices may be cleaved from a bar comprising nose-to-tail devices.

FIG. 6 is a graph comparing simulated losses for the zero order optical mode, solid lines, and the first order optical mode, dotted line, for two laser diodes according to the invention with passive waveguide sections of different lengths. The lower set of curves is for a laser diode whose passive separate ridge section is 10 μm long, whereas the upper set of curves describes the behavior of a laser diode whose passive separate ridge section is 50 μm long. As can be seen from the figure, the losses of the longer passive ridge section are greater, as would have been expected. However, the filter function of the structure, though present in both cases, is more pronounced with the longer passive separate ridge section. Thus, provided the losses are acceptable, a longer passive separate ridge section may be preferable. This allows the precise tuning of the passive separate ridge section and its adaptation to the environment, especially with regard to separate ridge section length and trench length.

FIG. 7 is a graph of life time measurements made of standard ridge waveguide laser diodes (without separate ridge sections) with laser diodes having passive separate ridge sections according to the invention. It compares the number of failures in a 5000 hour test by showing the function −log (Surv), where Surv is the survival function (or survival fraction) commonly describing the fraction of the population expected to survive until time t, (S(t)=n(t)/n(0). As can be seen from the graph, lasers designed according to the present invention can have a dramatically enhanced reliability compared with standard ridge waveguide laser diodes.

This process is realized in the preferred embodiment by performing the trench etch in the same processing step as the ridge etch. Thus there is no substantial change to the usual manufacturing process, compared with a standard ridge waveguide laser diode, except to pattern the top electrode 6 such that it does not cover the separate ridge section 12. In a less preferred embodiment the trench etch may be masked and etched separately from the ridge etch.

The manufacturing process then continues with the standard p-metallization processing and the subsequent steps known to a person skilled in the art.

The optical mode is guided (approximately centred) on the active layer. Preferably the laser is a weakly guiding ridge waveguide laser, with the active region below the ridge. By contrast strongly guiding ridge waveguides have the active layer within the ridge. The former are typically used for high power pump lasers, since they provide better thermal dissipation, and higher reliability. Under high power operation strongly guiding waveguides suffer from material weaknesses that occur at the edge of the active layer if it is etched through (related to in-built stress in the active layer), and then subject to a high current.

The depth of the trench affects the extent to which it overlaps with the optical mode that is centred on the active layer (with a bell-like intensity distribution that extends out into the cladding layers above and below). Preferably the laser is a Fabry-Perot laser (i.e. no grating), so that the lasing wavelength and modes are governed by means of a cavity length that is typically defined between the two facets of the laser diode chip. In the case of a Fabry-Perot laser a deep trench would create significant reflection and interfere with the cavity modes.

The drawings show only weakly guiding waveguides, in which the active layer is beneath the ridge, so that only a small proportion of the optical mode overlaps with the ridge. However, this invention is also applicable to a strongly guided mode, in which the active layer is within the ridge.

Preferably the trench is less deep than the thickness of the upper cladding layer, such that it does not reach the active layer. More preferably it is less than 75% of the ridge height. Preferably the depth of the trench is no deeper than the height of the ridge, and may be the same as the height of the ridge (FIG. 4*a*), so that the bottom of the trench is level with the bottom of the ridge, or most preferably the trench is less deep than the height of the ridge (FIG. 4*c*), so that the bottom of the trench is above the surrounding plateau, as opposed to below it (FIG. 4*b*). The separate ridge sections may or may not be provided with an electrode and driven.

The laser chip may be mounted onto an electrical carrier in a ridge side down orientation (i.e. the top of the ridge is adjacent to the electrical carrier). Where the separate ridge section has an electrode, this may be soldered or otherwise bonded onto the carrier, providing enhanced thermal dissipation from that section of the laser chip.

Additional advantages and modifications will readily occur to persons skilled in the art and the invention is therefore not limited to the specific embodiments, details, and steps shown and described hereinbefore.

The invention claimed is:

1. A semiconductor ridge waveguide laser diode including a semiconductor body, a ridge on a surface of the semiconductor body defining a waveguide between first and second facets, the ridge comprising a plurality of regions, including a main ridge section and a separate ridge section, separated by a physical separator, such as a trench, passing through at least a part of the height of the ridge, a first electrode on the ridge for injecting carriers into the laser diode, a second electrode located on a surface of the semiconductor body opposite to the surface having the ridge, wherein the separate ridge section has a ridge height and/or ridge width at one end different from the main ridge height and/or ridge width at an adjacent end of the main ridge section.

2. The laser diode according to claim 1, wherein the separate ridge section has a ridge width at said one end less than the ridge width at the adjacent end of the main ridge section.

3. The laser diode according to claim 1, wherein the separate ridge section has a ridge height at said one end less than the ridge height at the adjacent end of the main ridge section.

4. The laser diode according to claim 1, wherein the separate ridge section is substantially passive.

5. The laser diode according to claim 1, further including a third electrode provided on the separate ridge section for current injection into said separate ridge section.

6. The laser diode according to claim 1, wherein a plurality of separate ridge sections are provided, at least one ridge section being located adjacent to each facet.

7. The laser diode according to claim 1, wherein more than one separate ridge section is provided between the main ridge section and one of the facets, at least one of the separate ridge sections preferably having a mean ridge height and/or ridge width different from the mean ridge height and/or ridge width of the or each other separate ridge section.

8. The laser diode according to claim 1, wherein the separate ridge section is shorter than the main ridge section, and the separate ridge section is preferably between 10 and 500 μm long.

9. The laser diode according to claim 1, wherein the physical separator is a trench passing through the complete height of the ridge between the main ridge section and the separate ridge section.

10. The laser diode according to claim 1, wherein the physical separator is a trench between the main ridge section and the separate ridge section extending over 2 to 500 μm, preferably between 5 and 20 μm.

11. The laser diode according to claim 1, wherein the physical separator is a trench having a longitudinal extent at least as great as the mean diffusion length of free carriers within an active region of the laser diode.

12. The laser diode according to claim 1, wherein the separate ridge section has a ridge width of between 2 and 10 μm.

13. The laser diode according to claim 1, further comprising one or more isolation layers extending longitudinally along the semiconductor body, preferably substantially abutting the ridge.

14. The laser diode according to claim 13, wherein the isolation layers extend longitudinally and/or laterally over only a part of the semiconductor body.

15. The laser diode according to claim 13, wherein the laser diode body comprises GaAs, an active region comprises AlGaAs/InGaAs, and the isolation layer comprises SiN or SiO or SiON.

16. The laser diode according to claim 1, wherein the ridge includes at least one tapered portion, such that the ridge width widens towards at least one of the ends.

17. The laser diode according to claim 1, wherein the ridge has two end sections that are substantially dimensionally equal, and have identical cross sections, thus enabling strip-wise manufacturing with subsequent breaking or cleaving of the laser diodes.

18. A method of making a high power ridge waveguide laser diode having
- a ridge on a surface of the semiconductor body defining a waveguide between first and second facets,
- a first electrode on the ridge for injecting carriers into the laser diode,
- a second electrode located on a surface of the semiconductor body opposite to the surface having the ridge, said method comprising forming in the ridge a plurality of regions by providing a physical separation, such as a trench, through at least a part of the height of the ridge, so as to divide the ridge into a main ridge section and at least one separate ridge section,
  wherein the separate ridge section is substantially passive and has a ridge height and/or ridge width at one end different from the main ridge height and/or ridge width at an adjacent end of the main ridge section.

19. The method according to claim 18, wherein the separation is produced by controlled chemical etching of the ridge before depositing metallization.

* * * * *